United States Patent
Lee et al.

(10) Patent No.: US 9,000,576 B2
(45) Date of Patent: Apr. 7, 2015

(54) PACKAGE STRUCTURE AND MANUFACTURING METHOD THEREOF

(75) Inventors: Han-Hsiang Lee, Taipei (TW); Yi-Cheng Lin, Pingtung County (TW); Da-Jung Chen, Taoyuan County (TW)

(73) Assignee: Cyntec Co., Ltd., Hsinchu (TW)

( * ) Notice: Subject to any disclaimer, the term of this patent is extended or adjusted under 35 U.S.C. 154(b) by 0 days.

(21) Appl. No.: 13/590,197

(22) Filed: Aug. 21, 2012

(65) Prior Publication Data
US 2012/0313229 A1    Dec. 13, 2012

Related U.S. Application Data

(63) Continuation-in-part of application No. 13/092,163, filed on Apr. 22, 2011, now Pat. No. 8,269,330.

(51) Int. Cl.
*H01L 23/02* (2006.01)
*H01L 23/31* (2006.01)
*H01L 23/495* (2006.01)

(52) U.S. Cl.
CPC ...... *H01L 23/3107* (2013.01); *H01L 23/49537* (2013.01); *H01L 23/49551* (2013.01); *H01L 23/49575* (2013.01); *H01L 23/49589* (2013.01); *H01L 2224/16245* (2013.01); *H01L 2224/32245* (2013.01); *H01L 2224/33181* (2013.01); *H01L 2224/48247* (2013.01); *H01L 2224/73253* (2013.01); *H01L 2224/73265* (2013.01); *H01L 2924/13091* (2013.01); *H01L 2924/13055* (2013.01); *H01L 2924/3011* (2013.01); *H01L 2924/30107* (2013.01)

(58) Field of Classification Search
CPC .......... H01L 2224/48247; H01L 2224/33181; H01L 2224/32245; H01L 2924/3011; H01L 23/49551; H01L 23/49537; H01L 23/49575; H01L 23/3107

USPC .......... 257/306, 341, 401, 692, 686
See application file for complete search history.

(56) References Cited

U.S. PATENT DOCUMENTS 6,410,365 B1 *  6/2002  Kawata et al. ............... 438/123
2006/0263988 A1 * 11/2006  Takahashi et al. ............ 438/286

OTHER PUBLICATIONS

A System-in-Package (SIP) With Mounted Input Capacitors for Reduced Parasitic Inductances in a Voltage Regulator (Takayuki Hashimoto, Member, IEEE, Tetsuya Kawashima, TomoakiUno, Noboru Akiyama, Member, IEEE, Nobuyoshi Matsuura, and Hirofumi Akagi, Fellow, IEEE), Mar. 2010.*

* cited by examiner

*Primary Examiner* — Tan N Tran
(74) *Attorney, Agent, or Firm* — Min-Lee Teng; Litron Patent and Trademark Office

(57) ABSTRACT

The invention discloses a package structure for better heat-dissipation or EMI performance. A first conductive element and a second conductive element are both disposed between the top lead frame and the bottom lead frame. The first terminal of the first conductive element is electrically connected to the bottom lead frame, and the second terminal of the first conductive element is electrically connected to the top lead frame. The third terminal of the second conductive element is electrically connected to the bottom lead frame, and the fourth terminal of the second conductive element is electrically connected to the top lead frame. In one embodiment, a heat dissipation device is disposed on the top lead frame. In one embodiment, the molding compound is provided such that the outer leads of the top lead frame are exposed outside the molding compound.

17 Claims, 14 Drawing Sheets

PACKAGE STRUCTURE AND MANUFACTURING METHOD THEREOF

CROSS-REFERENCE TO RELATED APPLICATION

This application is a continuation-in-part of U.S. patent application Ser. No. 13/092,163, filed on Apr. 22, 2011, now U.S. Pat. No. 8,269,330, which is hereby incorporated herein by reference.

BACKGROUND OF THE INVENTION

I. Field of the Invention

The present invention relates to a package structure, and more particularly, to a package structure using lead frames.

II. Description of the Prior Art

Along with the rapid progress of the computer and internet communication during the recent years, the switching power supply is widely applied in the information and communication equipments including personal computers, servers, and routers, etc. . . . It is well known that a pair of MOSFET is common used as the voltage regulator in the switching power supply.

Please refer to FIG. 1, which is a schematic circuit diagram to demonstrate the operation of the MOSFET pair. It contains two MOSFETs, a first MOSFET 10 and a second MOSFET 20, as shown in FIG. 1, the drain of the first MOSFET 10 and the source of the second MOSFET 20 are electrically connected. The first MOSFET 10 and the second MOSFET 20 will regulate the input voltage from the voltage source $V_{in}$, and output to an output capacitor Cout and a device 30, such as a microprocessor through a coupling inductor Lout. Because the switching power supply has developed towards to the high-frequency range presently and there is much parasitic inductance in the circuit of FIG. 1, the Electromagnetic Interference (EMI) has become a serious problem needed to be overcome. Conventionally, there are several techniques has been adopted to tackle the EMI problem. A simple way is utilizing the package technique, for example, the technique of wire-free bonding to reduce the parasitic inductance. However, its improvement is very limited.

Please continuously refer to FIG. 1, wherein another conventional technique is connecting an input capacitor Cin to decouple the EMI. However, additional parasitic inductance will be produced if the input capacitor $C_{in}$ is mounted on a Printed Circuit Board (PCB). Therefore, it is not an optimized way to minimize the EMI loop.

Another conventional technique to solve the EMI problem is integrating the input capacitor $C_{in}$ with the MOSFET pair to form a module. Please refer to FIG. 2, which is a cross-sectional schematic diagram to demonstrate the structure of a conventional MOSFET module 100. The module 100 has a pair of MOSFET, a first MOSFET 40 and a second MOSFET 50, which are mounted side by side between a bottom lead frame 60 and a copper plate 70. And, the first MOSFET 40 and the second MOSFET 50 are electrically connected with the bottom lead frame 60 and the copper plate 70 respectively. An input capacitor 80 is mounted on the copper plate 70, such that it is electrically connected with the first MOSFET 40 and the second MOSFET 50 respectively via the copper plate 70. Accordingly, the module 100 can form a short EMI loop; therefore it is more effective to suppress the EMI comparing to other techniques discussed previously.

Nevertheless, the structure of the module 100 has several disadvantages which include: a. The connecting point of the copper plate 70 and the bottom lead frame 60 will induce an impedance to degrade the module performance; and b. The thermal-dissipation ability of the module 100 is limited because it can just dissipate the heat through the bottom lead frame 60 when mounting on a PCB.

Consequently, the present invention proposes a module, which has a pair of MOSFET and an input capacitor stacked on an up lead frame, to overcome the above mentioned problems and disadvantages.

SUMMARY OF THE INVENTION

One objective of the present invention is to provide a package structure for better heat-dissipation. The package structure comprises: a bottom lead frame; a top lead frame having a platform and a plurality of outer leads; a first conductive element comprising a first terminal and a second terminal, disposed between the top lead frame and the bottom lead frame, wherein the first terminal of the first conductive element is electrically connected to the bottom lead frame, and the second terminal of the first conductive element is electrically connected to the top lead frame; and a second conductive element comprising a third terminal and a fourth terminal, disposed between the top lead frame and the bottom lead frame, wherein the third terminal of the second conductive element is electrically connected to the bottom lead frame, and the fourth terminal of the second conductive element is electrically connected to the top lead frame. In one embodiment, the molding compound is provided such that the outer leads of the top lead frame are exposed outside the molding compound.

The package structure of the present invention can be applied to form a powerful SiP module. For example, a heat dissipation device is disposed on the top lead frame to further improve heat-dissipation efficiency.

In one embodiment, a third conductive element is disposed on the top lead frame, wherein a fifth terminal of the third conductive element is electrically connected to the first portion of the platform, and a sixth terminal of the third conductive element is electrically connected to the second portion of the platform. The top lead frame, the bottom lead frame, the first conductive element, the second conductive element and the third conductive element are configured and electrically connected by wire-free process so as to form a circuit loop, accordingly the structure has an short EMI loop and lower parasitic inductance.

Another objective of the present invention is to provide a method for forming a package structure. The method comprises the steps of: providing a bottom lead frame and a top lead frame, wherein the top lead frame has a platform and a plurality of outer leads; and disposing a first conductive element and a second conductive element between the top lead frame and the bottom lead frame, wherein the first conductive element comprises a first terminal and a second terminal, and the second conductive element comprises a third terminal and a fourth terminal, wherein the first terminal of the first conductive element is electrically connected to the bottom lead frame; the second terminal of the first conductive element is electrically connected to the top lead frame; the third terminal of the second conductive element is electrically connected to the bottom lead frame; and the fourth terminal of the second conductive element is electrically connected to the top lead frame.

The present invention has following advantages: 1. The top lead frame may be a one-piece-form, so it has low inner impedance; 2. The structure has no parasitic inductance caused by the PCB and it has a short EMI loop; 3. The heat-dissipation ability of the structure is excellent because the heat generated by the first conductive element and the second conductive element can simultaneously dissipate from the bottom lead frame and the top lead frame; 4. The structure has excellent extensibility to form a stacking SiP module; 5. By wire-free process, parasitic inductance caused by the wires can be reduced a lot.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein:

FIG. 8c-1 illustrates a schematic cross-sectional view of the structure with a heat-dissipation device in accordance with the third embodiment of the present invention;

FIG. 8c-2 illustrates a circuit diagram of the structure in FIG. 8c-1;

FIG. 9b-1 illustrates a schematic cross-sectional view of the structure with a fourth conductive element thereon in accordance with the fourth embodiment of the present invention;

FIG. 9b-2 illustrates a circuit diagram of the structure in FIG. 9b-1;

FIG. 9c-1 illustrates a schematic cross-sectional view of the structure with a fifth conductive element mounted on the bottom lead frame of the structure in FIG. 9b-1.

FIG. 9c-2 illustrates a circuit diagram of the structure in FIG. 9c-1; and

DESCRIPTION OF THE PREFERRED EMBODIMENT

The detailed explanation of the present invention is described as following. The described preferred embodiments are presented for purposes of illustrations and description, and they are not intended to limit the scope of the present invention.

Figure 3:
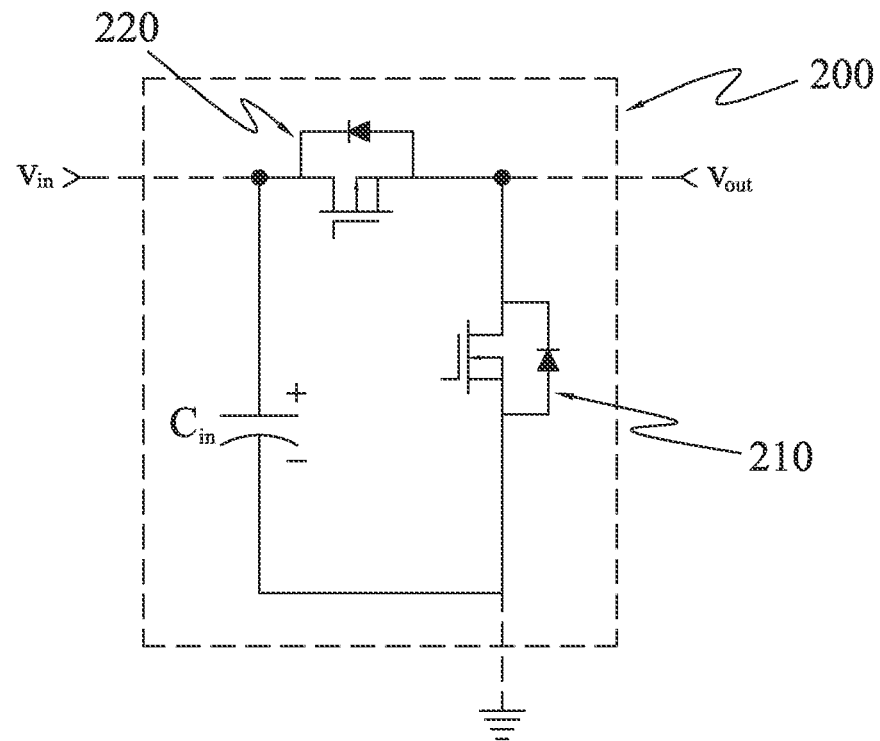
FIG. 3 is a schematic circuit diagram of the present invention.

Firstly, please refer to FIG. 3, which is a schematic circuit diagram of the present invention. A MOSFET pair with a stack capacitor 200 has a first MOSFET 210, a second MOSFET 220, and a capacitor $C_{in}$. The MOSFET pair with a stack capacitor 200 receives an input voltage $V_{in}$ from a voltage source (not shown in FIG. 3) and output an output voltage $V_{out}$ to a device (not shown in FIG. 3).

Figure 4A:
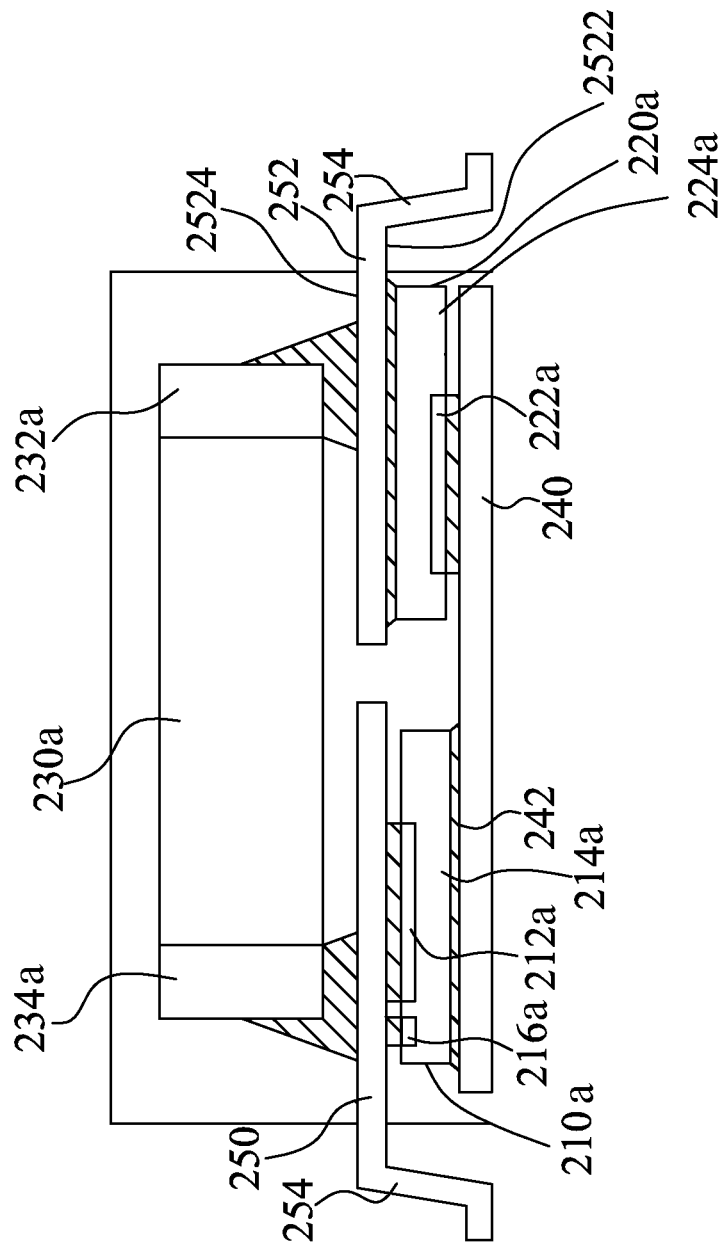
FIG. 4A is a cross-sectional schematic diagram to demonstrate the structure of an embodiment of the present invention.

Please refer to FIG. 4A, which is a cross-sectional schematic diagram to demonstrate the structure of the first embodiment of the present invention. The structure in FIG. 4A includes a bottom lead frame 240 having a up surface 242; an up lead frame 250 having a platform 252, and a plurality of outer leads 254, wherein the platform 252 has an inner surface 2522 and an outer surface 2524; a first conductive element 210a mounted between the inner surface 2522 of the up lead frame 250 and the up surface 242 of the bottom lead frame 240, wherein the first conductive element 210a comprises a first terminal 212a electrically connected with the up lead frame 250 and a second terminal 214a electrically connected with the bottom lead frame 240; a second conductive element 220a mounted between the inner surface 2522 of the up lead frame 250 and the up surface 242 of the bottom lead frame 240, wherein the second conductive element 220a is mounted beside the first conductive element 210a, and the second conductive element 220a has a third terminal 222a electrically connected with the bottom lead frame 240 and a second fourth terminal 224a electrically connected with the up lead frame 250. In one embodiment, the first conductive element 210a comprises another terminal 216a electrically connected with the up lead frame 250.

In one embodiment, and a third conductive element 230a is mounted on the outer surface 2524 of the up lead frame 250, in which third conductive element 230a has a fifth terminal 232a and a sixth terminal 234a electrically connected with the up lead frame 250 respectively, wherein the first terminal 212a and the fourth terminal 224a are electrically connected with the sixth terminal 234a and the fifth terminal 232a respectively via the up lead frame 250.

Figure 4B:
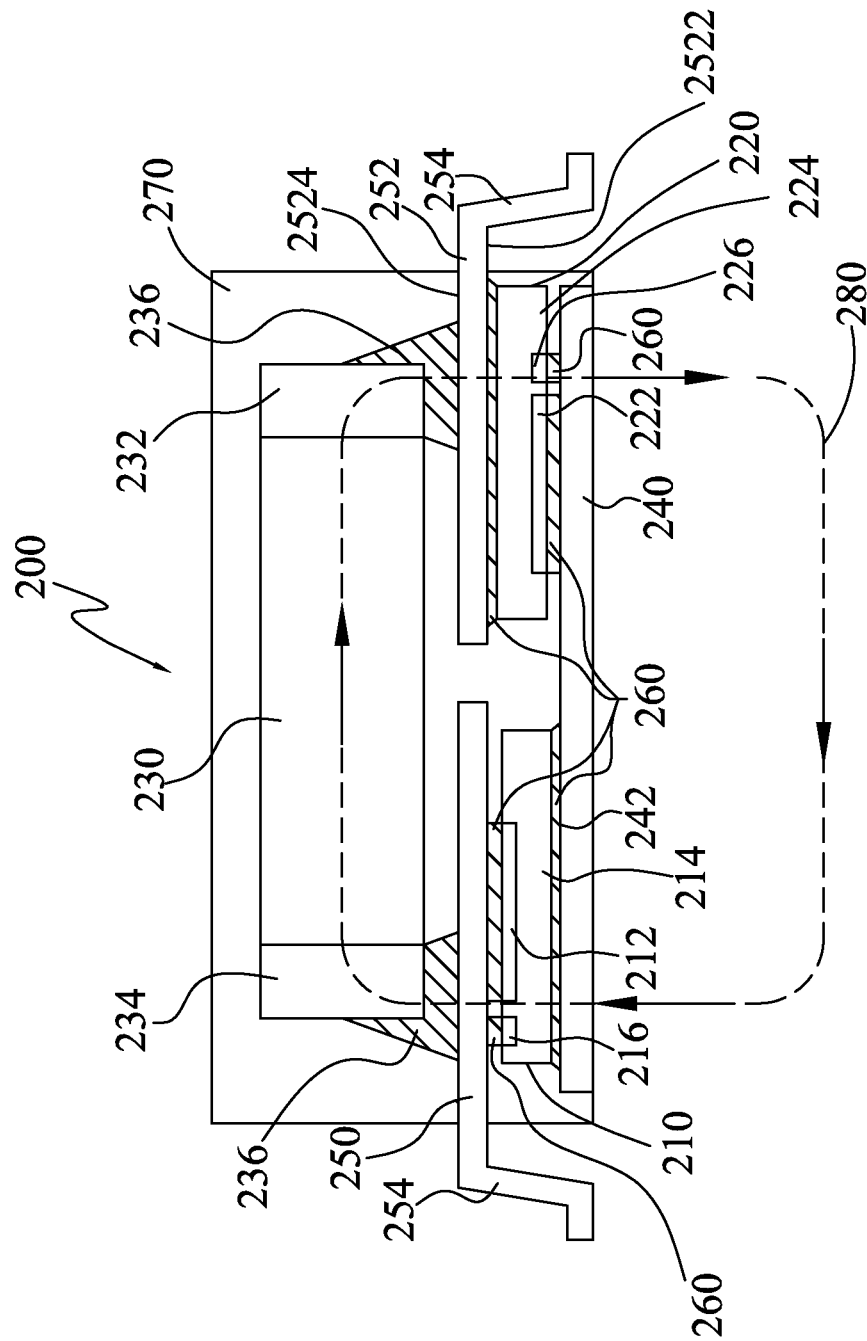
FIG. 4B is a cross-sectional schematic diagram to demonstrate the structure of the first embodiment of the present invention.

Then, please simultaneously refer to FIG. 4B, which is a cross-sectional schematic diagram to demonstrate the structure of the first embodiment of the present invention, which its electrical circuit diagram is corresponding to FIG. 3. The MOSFET pair with a stack capacitor 200, comprises: a bottom lead frame 240 having a up surface 242; an up lead frame 250 having a platform 252, and a plurality of outer leads 254, wherein the platform 252 has an inner surface 2522 and an outer surface 2524; a first MOSFET 210 mounted between the inner surface 2522 of the up lead frame 250 and the up surface 242 of the bottom lead frame 240, wherein the first MOSFET 210 has a first source electrode 212, a first drain electrode 214, and a first gate electrode 216, in which the first source electrode 212 and the first gate electrode 216 are electrically connected with the up lead frame 250 respectively, and the first drain electrode 214 is electrically connected with the bottom lead frame 240; a second MOSFET 220 mounted between the inner surface 2522 of the up lead frame 250 and the up surface 242 of the bottom lead frame 240, wherein the second MOSFET 220 is mounted beside the first MOSFET 210, and the second MOSFET 220 has a second source electrode 222, a second drain electrode 224, and a second gate electrode 226, in which the second source electrode 222 and the second gate electrode 226 are electrically connected with the bottom lead frame 240 respectively, and the second drain electrode 224 is electrically connected with the up lead frame 250; and a capacitor 230 mounted on the outer surface 2524 of the up lead frame 250, in which the capacitor 230 has a first capacitor electrode 232 and a second capacitor electrode 234 electrically connected with the up lead frame 250 respectively, wherein the first source electrode 212 and the second drain electrode 224 are electrically connected with the second capacitor electrode 234 and the first capacitor electrode 232 respectively via the up lead frame 250.

Please continuously refer to FIG. 4B. The MOSFET pair with a stack capacitor 200 may further comprise a molding compound 270 to protect the whole module. The molding compound 270 covers the bottom lead frame 240, the platform 252 of the up lead frame 250, the first MOSFET 210, the second MOSFET 220, and the capacitor 230, wherein the outer leads 254 of the up lead frame 250 are exposed to the molding compound 270. In one embodiment, the material of the molding compound 270 is epoxy resin.

Continuing the above description, in one embodiment, the bottom lead frame 240 or the up lead frame 250 may be a one-piece-form. In one embodiment, the material of the bottom lead frame 240 or the up lead frame 250 may be copper.

Please continuously refer to FIG. 4B. The first capacitor electrode 232 and the second capacitor electrode 234 are electrically connected with the up lead frame 250 by solder 236 in the first embodiment. And in this embodiment, all of the electrical bonding for the first MOSFET 210 and the second MOSFET 220 with the bottom lead frame 240 and the up lead frame 250 are implemented by solder 260. However, there are several popular ways including solder, Ag epoxy, and gold balls to implement the electrical bonding for the first MOSFET 210 and the second MOSFET 220 with the bottom lead frame 240 and the up lead frame 250. The optimum way is depending on which one is simpler, easier, or cheaper for the various kinds of the MOSFET and lead frames.

Figure 5:
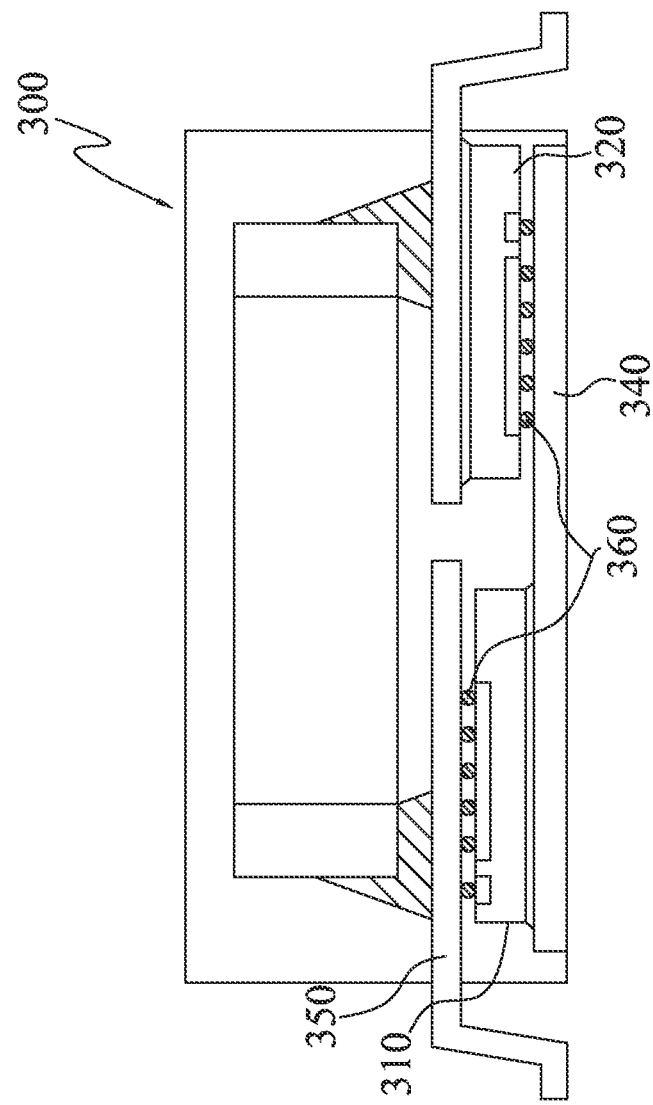
FIG. 5 is a cross-sectional schematic diagram to demonstrate the structure of the second embodiment of the present invention.

Therefore, the second embodiment of the present invention is described as follows. Please refer to FIG. 5, which is a cross-sectional schematic diagram to demonstrate the structure of the second embodiment of the present invention. Please simultaneously refer to FIG. 4B, the difference between the structure of the second embodiment and the first one is that the MOSFET pair with a stack capacitor 300 of the former one (FIG. 5) adopts the gold balls 360 to electrically connect the first MOSFET 310 and the second MOSFET 320 with the up lead frame 350 and the bottom lead frame 340.

Figure 6:
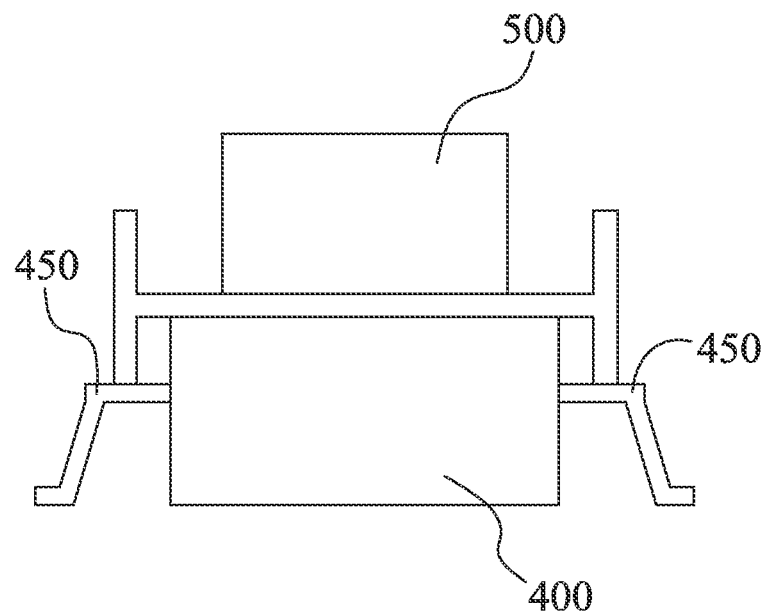
FIG. 6 is a schematic diagram to demonstrate one embodiment of the present invention.

Furthermore, the MOSFET pair with a stack capacitor of the present invention is suitable for extending to a more powerful SiP module because it has an up lead frame. Please refer to FIG. 6, which is a schematic diagram to demonstrate one embodiment of the present invention. A device 500 is stacked above the MOSFET pair with a stack capacitor 400 of the present invention, wherein the MOSFET pair with a stack capacitor 400 has an up lead frame 450. In one embodiment, the device 500 may be an IGBT, a diode, an inductor, a choke, or a heat sink.

To make a brief summary, one feature of the present invention is that the MOSFET pair with a stack capacitor of the present invention has an up lead frame, which has several advantages including: 1. The up lead frame may be a one-piece-form, so it has low inner impedance; 2. The input capacitor is directly mounted on the up lead frame, so the module has no parasitic inductance caused by the PCB and it has an optimized short EMI loop 280 (Please refer to FIG. 4B.); 3. The thermal-dissipation ability of the module is excellent because the heat generated by two MOSFETs can simultaneously dissipate from the bottom lead frame and the up lead frame; and 4. The module has excellent extensibility because it can be stacked some other device, such as an IGBT, a diode, an inductor, a choke, and a heat sink above the up lead frame, to form a more powerful SiP module.

Besides, there are many advantages of the MOSFET pair with a stack capacitor according to the present invention, which includes: a. The module is wire-free bonding, so there is no parasitic inductance caused by the wires; b. The module has excellent structural flexibility because it can adopt solder, Ag epoxy, or gold balls to implement the electrical bonding of two MOSFETs with the bottom lead frame and the up lead frame.

Figure 7A:
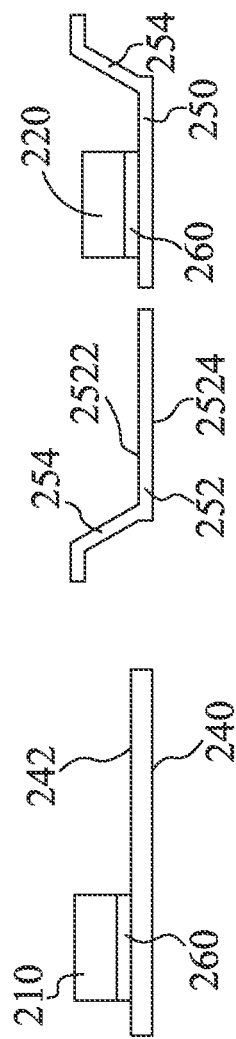
FIG. 7a to FIG. 7d are the schematic diagrams to demonstrate a method of manufacturing a MOSFET pair with a stack capacitor of the first embodiment.
Figure 7B:
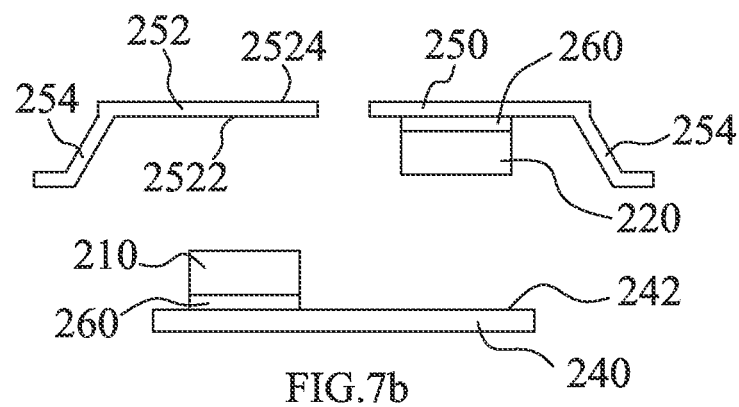
Figure 7C:
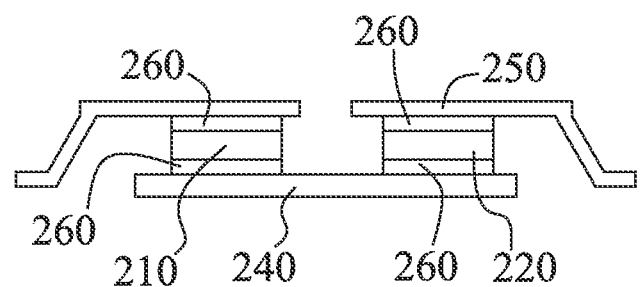
Figure 7D:
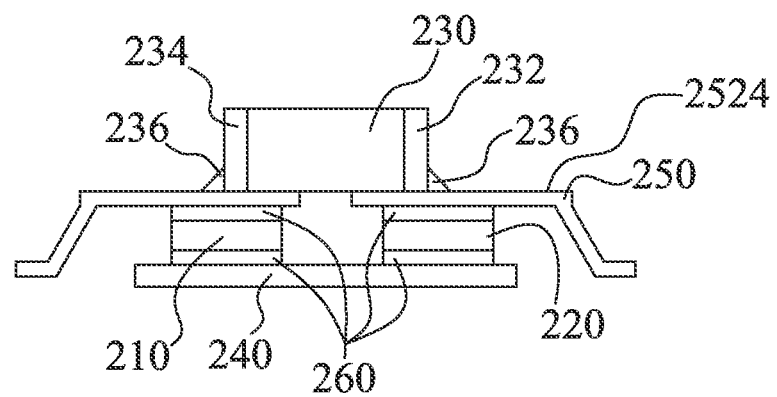

Next, a method of manufacturing a MOSFET pair with a stack capacitor of the first embodiment is described as follows. Please refer to FIG. 7a to FIG. 7d, which are the schematic diagrams to demonstrate a method of manufacturing a MOSFET pair with a stack capacitor of the first embodiment. And, please simultaneously refer to FIG. 4B. The method comprises: providing a bottom lead frame 240 which has an up surface 242 (FIG. 7a); providing an up lead frame 250 which has a platform 252, and a plurality of outer leads 254, wherein the platform 252 has an inner surface 2522 and an outer surface 2524 (FIG. 7a); bonding a first MOSFET 210 on the up surface 242 of the bottom lead frame 240 (FIG. 7a); bonding a second MOSFET 220 on the inner surface 2522 of the up lead frame 250 (FIG. 7a); flipping the up lead frame 250 to make the inner surface 2522 of the up lead frame 250 face onto the up surface 242 of the bottom lead frame 240 (FIG. 7b); bonding the first MOSFET 210 with the up lead frame 250 (FIG. 7c); bonding the second MOSFET 220 with the bottom lead frame 240 (FIG. 7c); and bonding a capacitor 230 on the outer surface 2524 of the up lead frame 250 (FIG. 7d). The completed structure is shown in FIG. 4B. Because it is easy to understand by simultaneous referring FIG. 4B, the details of the electrodes and those electrical connections are not depicted in FIG. 7a to FIG. 7d and are not described in the above explanation.

Continuing the above description, in one embodiment, the step of bonding the first MOSFET 210 with the up lead frame 250 and the step of bonding the second MOSFET 220 with the bottom lead frame 240 may be executed separately or simultaneously.

In one embodiment, the method of manufacturing a MOSFET pair with a stack capacitor of the present invention may further comprise forming a molding compound 270 (Please refer to FIG. 4B.) to cover the bottom lead frame 240, the platform 252 of the up lead frame 250, the first MOSFET 210, the second MOSFET 220, and the capacitor 230, wherein the outer leads 254 of the up lead frame 250 are exposed to the molding compound. Because it has been explained for FIG. 4B previously, it is not further described here.

Moreover, in one embodiment (Please refer to FIG. 6.), the method of manufacturing a MOSFET pair with a stack capacitor of the present invention may further comprise mounting a device 500 to stack above the up lead frame 450. Because it has been explained for FIG. 6 previously and it is easy for a person skilled in the art to be understood, it is not further described here.

Owing to other methods to manufacture the other embodiments of the present invention are similar to the above described method, they are not further described here.

To make a brief summary in above description, the present invention provides a simple method to manufacture the MOSFET pair with a stack capacitor of the present invention. It is time-saving, flexible, cost-effective, and facile.

Figure 8A:
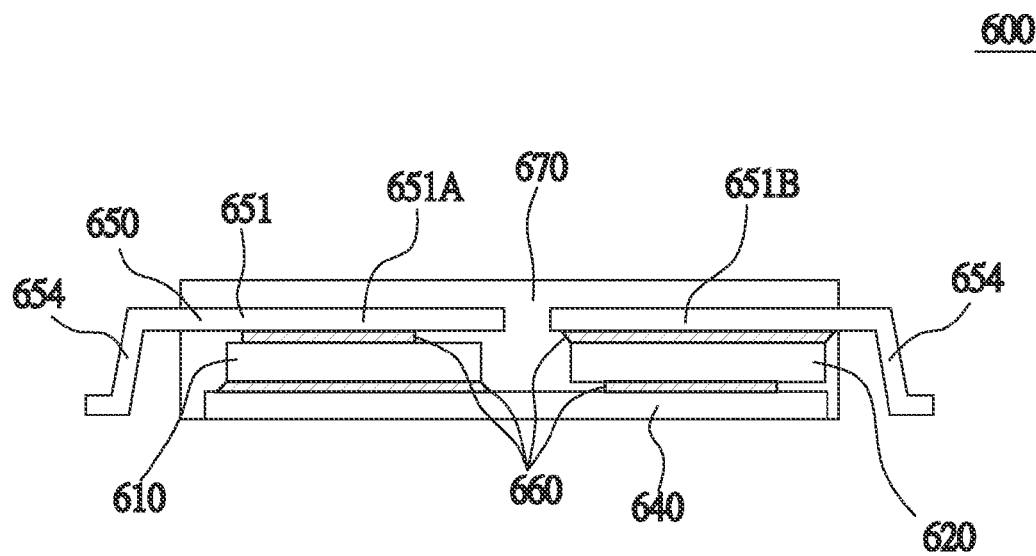
FIG. 8a illustrates a schematic cross-sectional view of the structure in accordance with the third embodiment of the present invention.

FIG. 8a illustrates a schematic cross-sectional view of the structure 600 in accordance with the third embodiment of the present invention. For convenience of explanation, the I/O terminals in the following figures are not shown. The structure 600 mainly includes a top lead frame 650, a bottom lead frame 640, a first conductive element 610 and a second conductive element 620.

The first conductive element 610 is disposed between the top lead frame 650 and the bottom lead frame 640. The first conductive element 610 can be an IC chip, a MOSFET, an IGBT, a diode, a resistor, an inductor, a choke or a capacitor. Preferably, the first conductive element 610 is a MOSFET. The first conductive element 610 comprises a first terminal and a second terminal, wherein the first terminal of the first conductive element 610 is electrically connected to the bottom lead frame 640, and the second terminal of the first conductive element 620 is electrically connected to the top lead frame 650. The second conductive element 620 is disposed between the top lead frame 650 and the bottom lead frame 640, preferably beside the first conductive element 610. The second conductive element 620 can be an IC chip, a MOSFET, an IGBT, a diode, a resistor, an inductor, a choke or a capacitor. Preferably, the second conductive element 620 is a MOSFET. The second conductive element 620 comprises a third terminal and a fourth terminal, wherein the third terminal of the second conductive element 620 is electrically connected to the bottom lead frame 640, and the fourth terminal of the second conductive element 620 is electrically connected to the top lead frame 650. The wire-free process to perform the above electrical connection has been described previously (see FIG. 4B and FIG. 5), such as solder, Ag gluing 660 or ball bonding, so it will not further described herein.

The top lead frame 650 has a platform 651 and a plurality of outer leads 654. The platform 651 has a first portion 651A and a second portion 651B. Optionally, the first portion 651A is horizontally spaced from the second portion 651B. Preferably, the first portion 651A and the second portion 651B are substantially in the same horizontal level.

Figure 8B:
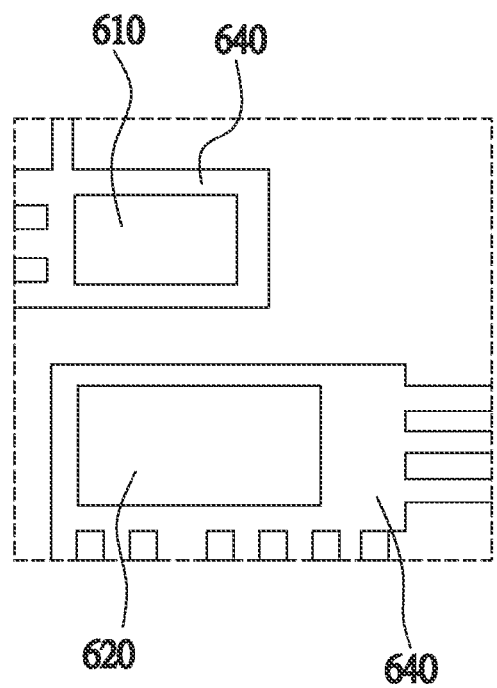
FIG. 8b illustrates a top view of the structure in which the top lead frame is omitted in accordance with the third embodiment of the present invention.

FIG. 8b illustrates a top view of the structure 600 in which the top lead frame 650 is omitted in accordance with the third embodiment of the present invention. A first portion of the bottom lead frame 640 on which the first conductive element 610 is mounted is spaced from a second portion of the bottom lead frame 640 on which the second conductive element 620 is mounted.

Please refer again to FIG. 8a, a molding compound 670 can encapsulate the top lead frame 650, the bottom lead frame 640, the first conductive element 610 and the second conductive element 620. In one embodiment, the outer leads 654 of the top lead frame 650 can be exposed outside the molding compound 670 to improve heat-dissipation efficiency. The molding compound 670 can include any suitable material, such as resin or epoxy.

Figure 1:
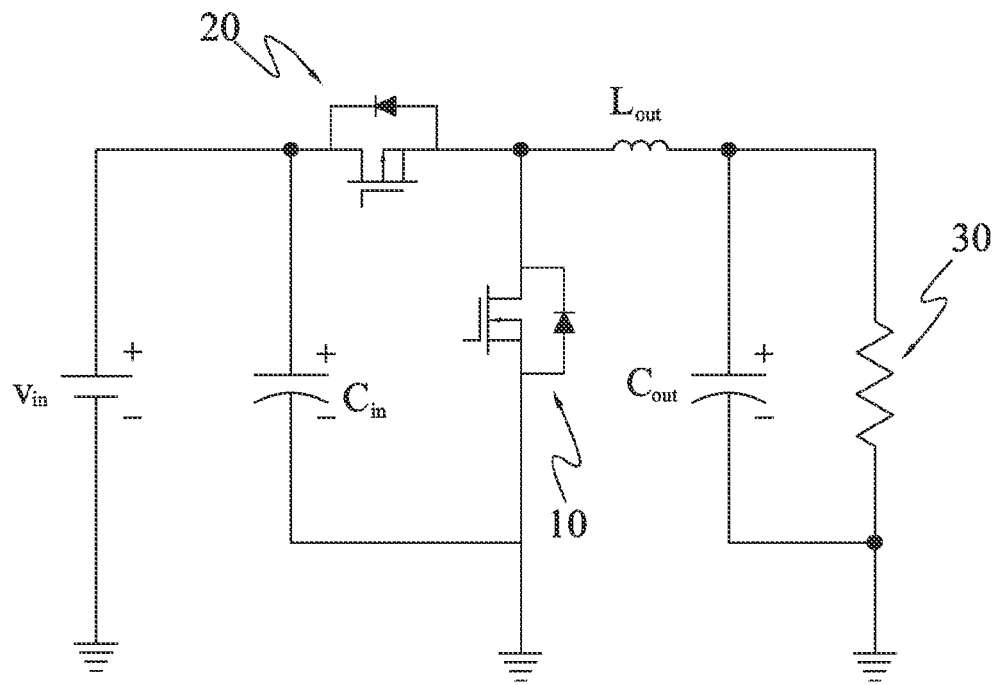
FIG. 1 is a schematic circuit diagram to demonstrate the operation of the MOSFET pair.
Figure 2:
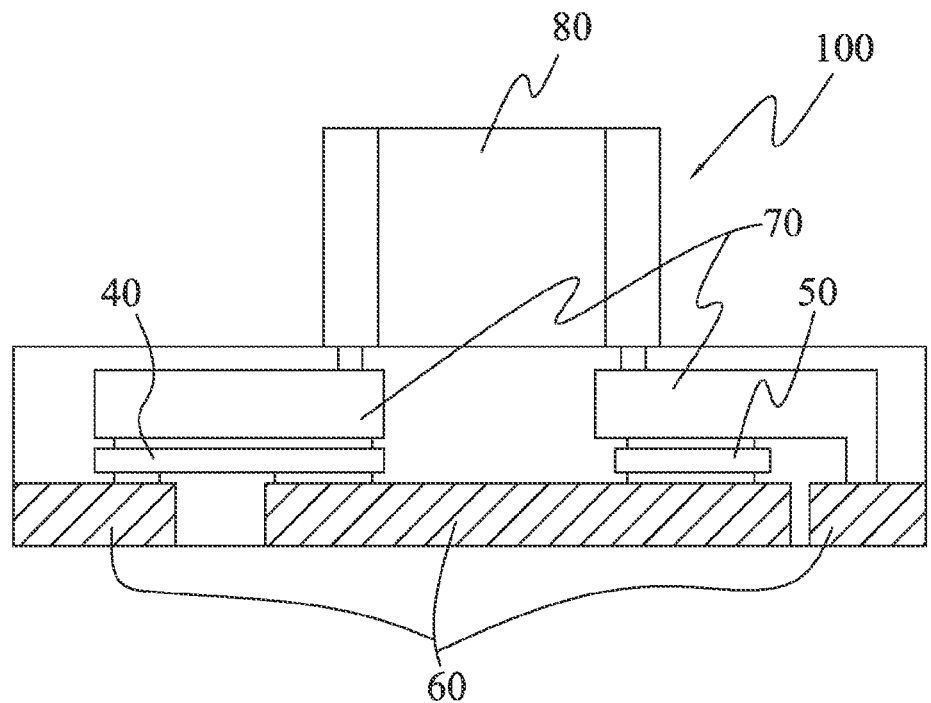
FIG. 2 is a cross-sectional schematic diagram to demonstrate the structure of a conventional MOSFET module.
Figures 1, 8C:
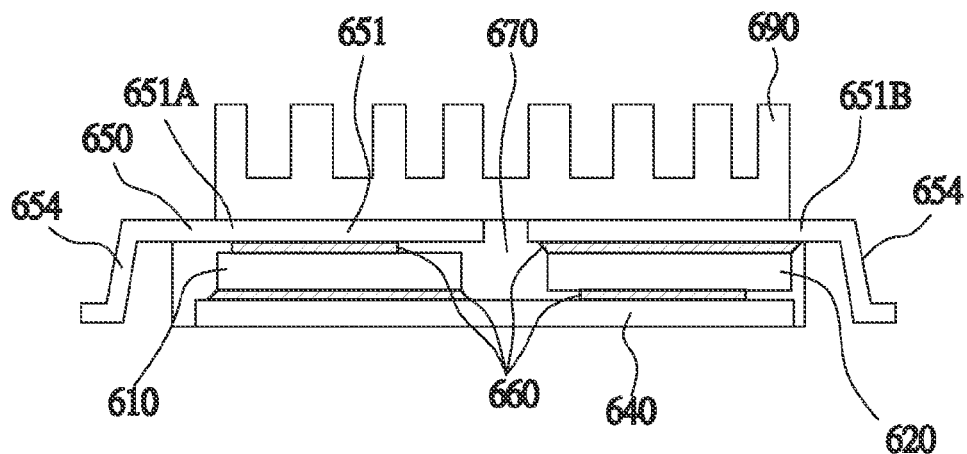
Figures 2, 8C:
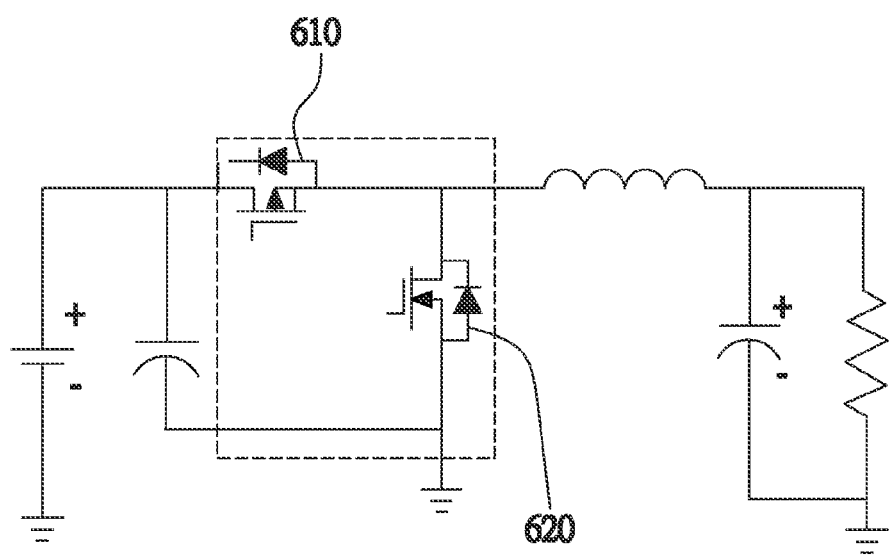

In one embodiment, please refer to FIG. 8c-1, the top surface of the top lead frame 650 is exposed such that a heat-dissipation device 690 is disposed on top surface of the top lead frame 650, thereby improving double-sided heat-dissipation efficiency (e.g., the top lead frame 650 and the bottom lead frame 640). The structure in FIG. 8c-1 can be a dotted-line portion of the circuit diagram of FIG. 8c-2 (e.g., double side cooling QFN).

Figure 9A:
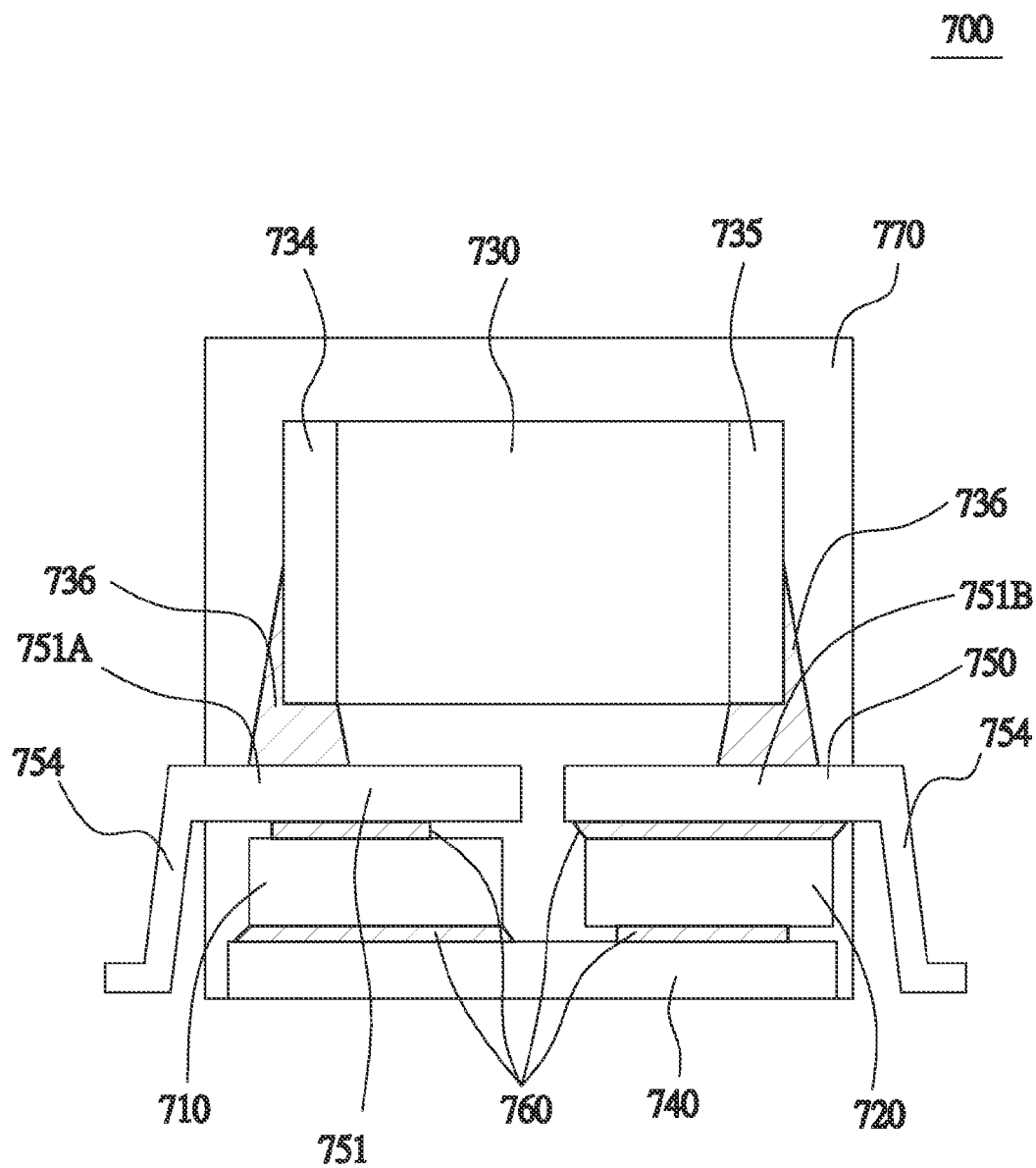
FIG. 9a illustrates a schematic cross-sectional view of the structure in accordance with the fourth embodiment of the present invention.

FIG. 9a illustrates a schematic cross-sectional view of the structure 700 in accordance with the fourth embodiment of the present invention. The structure 700 mainly includes a top lead frame 750, a bottom lead frame 740, a first conductive element 710, a second conductive element 720 and a third conductive element 730. Compared to the structure 700 in FIG. 8b, the difference is that a third conductive element 730 is disposed on the top lead frame 750, wherein a fifth terminal 734 of the third conductive element 730 is electrically connected to the first portion 751A of the platform 751, and a sixth terminal 735 of the third conductive element 730 is electrically connected to the second portion 751B of the platform 751. In this case, the fifth terminal 734 and the sixth terminal 735 of the third conductive element 730 are disposed on opposite ends of the third conductive element 730; however, the present invention is not limited to this arrangement. The third conductive element 730 can be an IC chip, a MOSFET, an IGBT, a diode, a resistor, an inductor, a choke or a capacitor. Preferably, the third conductive element 730 is a capacitor.

In a preferred embodiment, the top lead frame 750, the bottom lead frame 740, the first conductive element 710, the second conductive element 720 and the third conductive element 730 are configured so as to form a circuit loop. More specifically, the sequence of the circuit loop similar to FIG. 3 includes the bottom lead frame 740, the first conductive element 710, the first portion 751A of the platform 751, the third conductive element 730, the second portion 751B of the platform 751 and the second conductive element 720.

Furthermore, the package structure of the present invention can be applied to form a powerful SiP module due to the top lead frame 750. For example, please refer to FIG. 9b-1, a fourth conductive element 731 can be stacked on the structure 700 in FIG. 9a-1. The structure in FIG. 9b-1 can be a dotted-line portion of the circuit diagram of FIG. 9b-2 (e.g., sandwich QFN). The fourth conductive element 731 can be an IC chip, a MOSFET, an IGBT, a diode, a resistor, an inductor, a choke, a capacitor or a heat sink, preferably a choke.

Figures 1, 9B:
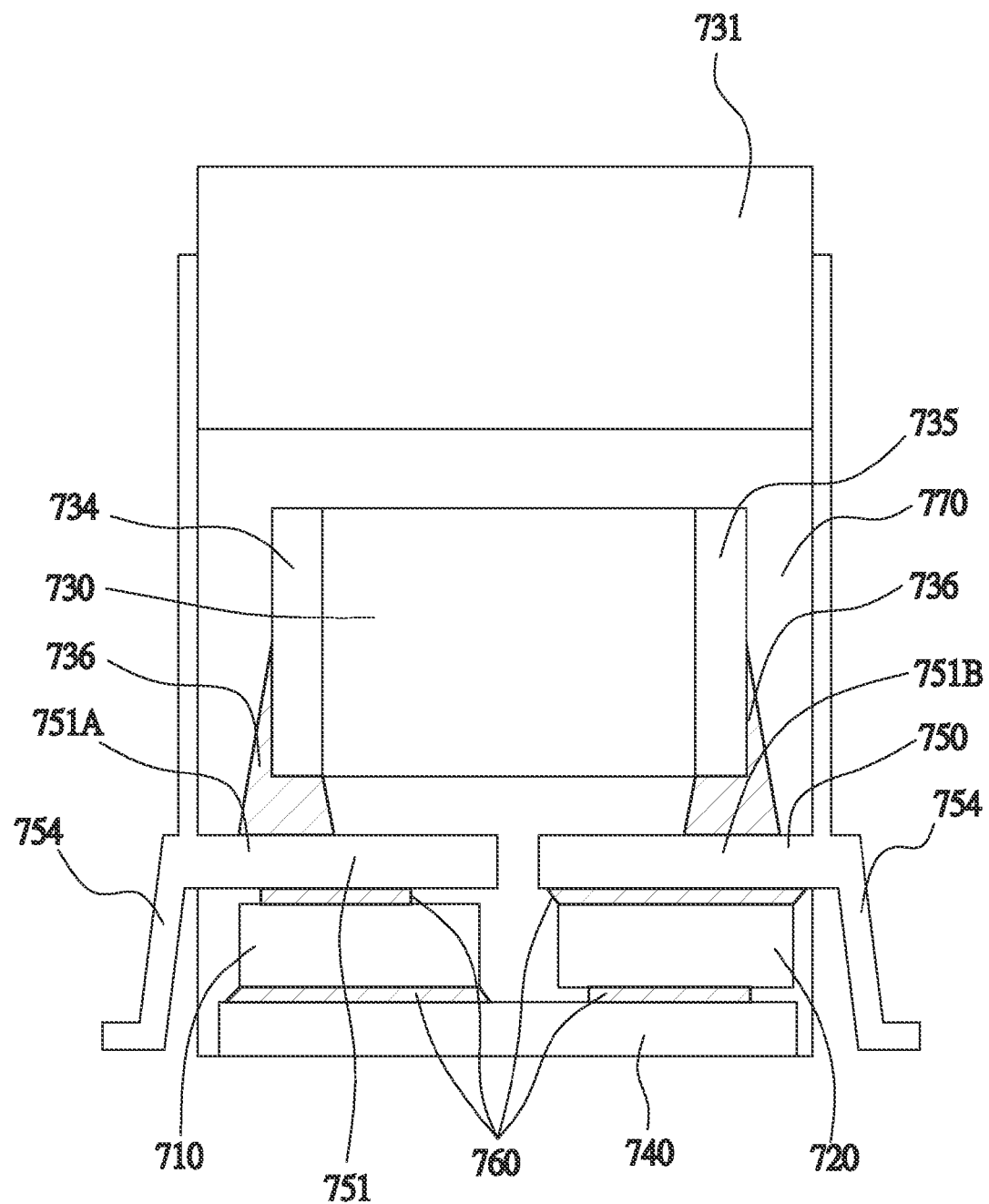
Figures 2, 9B:
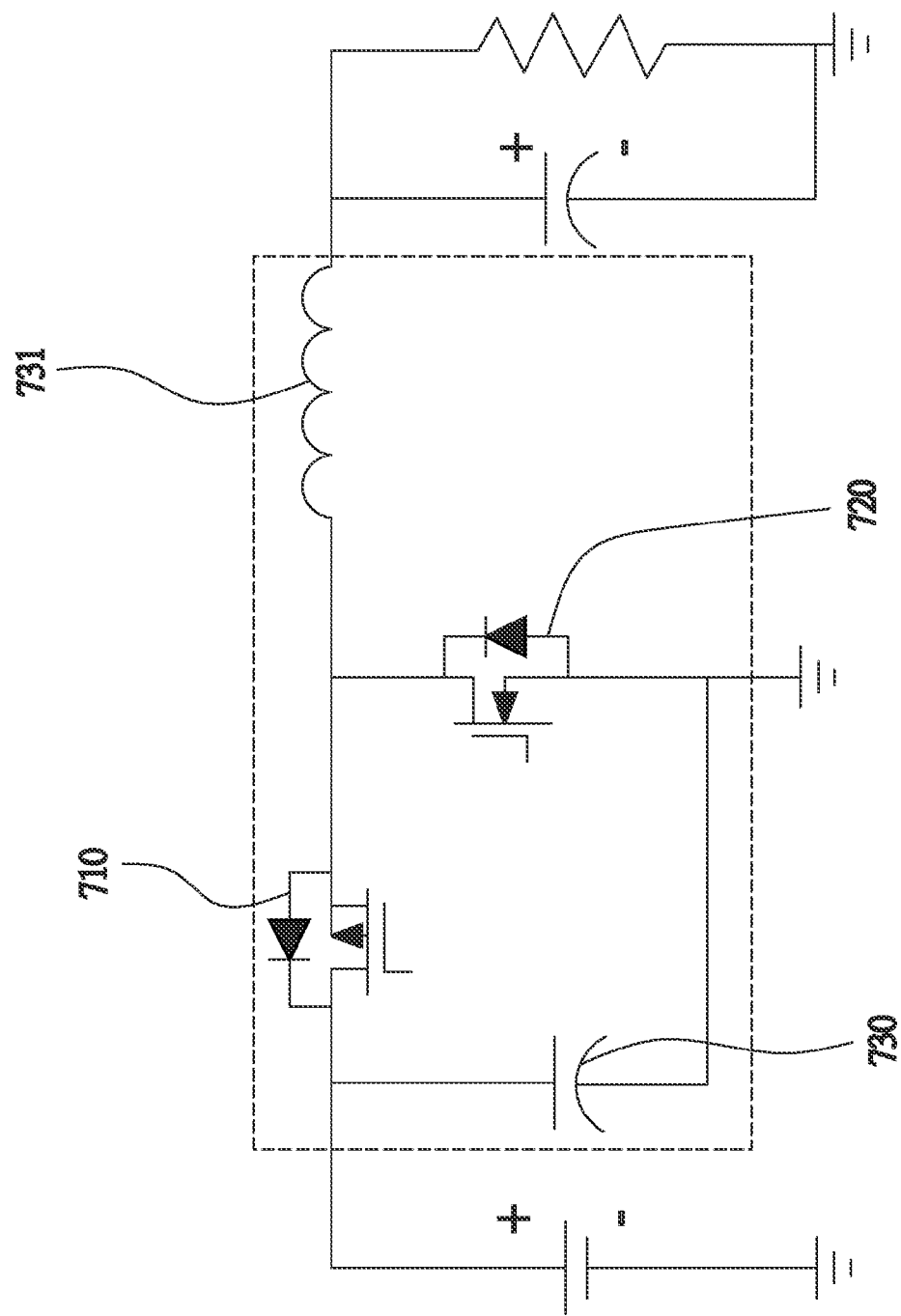
Figures 1, 9C:
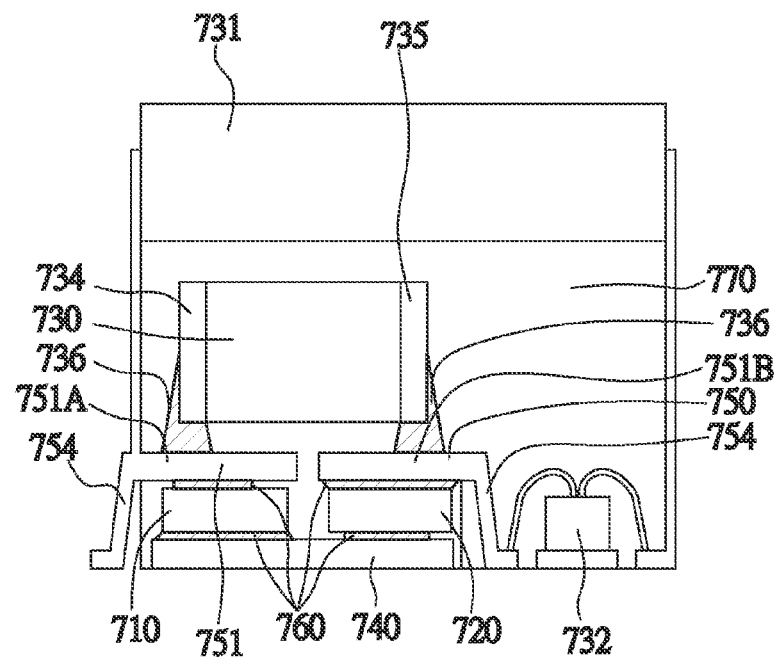
Figures 2, 9C:
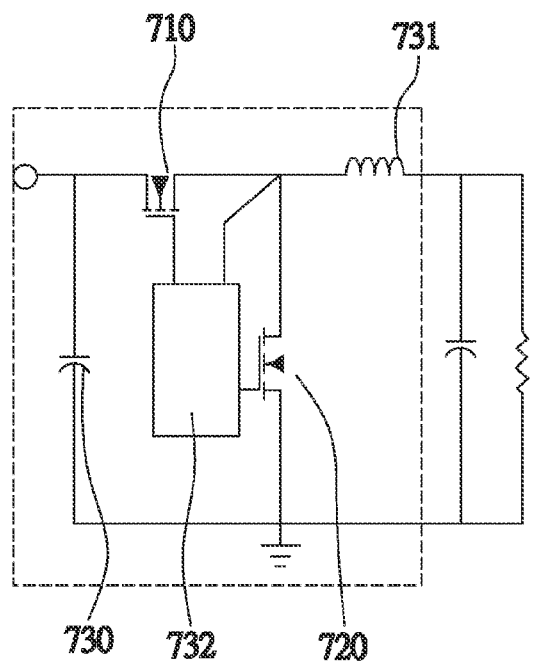

In one embodiment, please refer to FIG. 9c-1, a fifth conductive element 732 can be mounted on the bottom lead frame 740 of the structure in FIG. 9b-1. The fifth conductive element 732 can be an IC chip, a MOSFET, an IGBT, a diode, a resistor, an inductor, a choke, a capacitor or a heat sink, preferably a control IC disposed by wire-bond process. The structure in FIG. 9c-1 can be in a dotted-line portion of the circuit diagram of FIG. 9c-2 (e.g., POL QFN).

Figure 10:
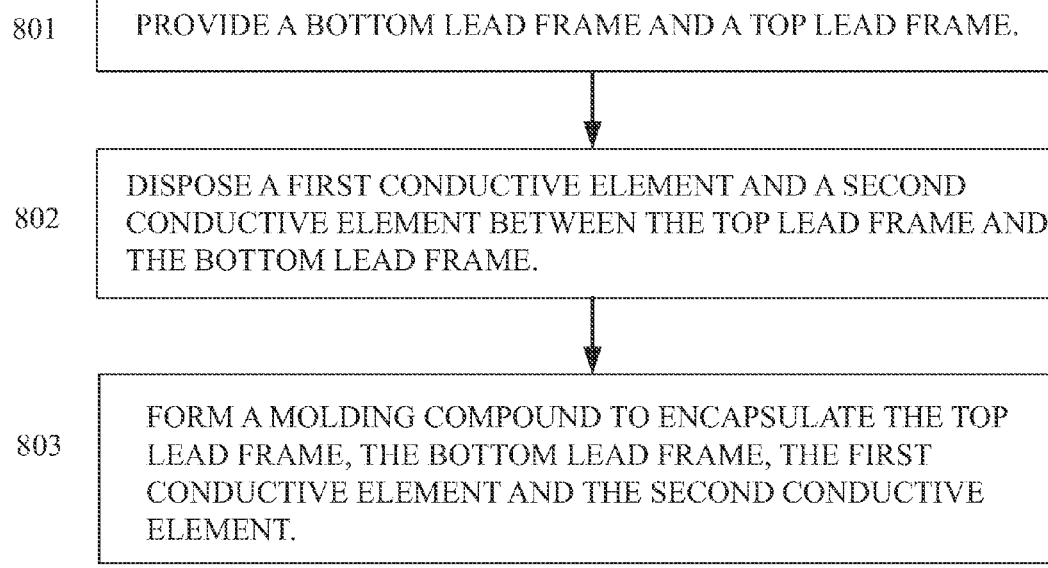
FIG. 10 illustrates a process flow of a method for manufacturing the structure in FIG. 8a and the structure in FIG. 9a in the present invention.

FIG. 10 illustrates a process flow of a method for manufacturing the structure 600 in FIG. 8a and the structure 700 in FIG. 9a. In step 801, provide a bottom lead frame 640, 740 and a top lead frame 650, 750. The top lead frame 650, 750 has a platform 651, 751 and a plurality of outer leads 654, 754. In step 802, dispose a first conductive element 610, 710 and a second conductive element 620, 720 between the top lead frame 650, 750 and the bottom lead frame 640, 740. The first conductive element 610, 710 comprises a first terminal and a second terminal, and the second conductive element 620, 720 comprises a third terminal and a fourth terminal, wherein the first terminal of the first conductive element 610, 710 is electrically connected to the bottom lead frame 640, 740; the second terminal of the first conductive element 610, 710 is electrically connected to the top lead frame 650, 750; the third terminal of the second conductive element 620, 720 is electrically connected to the bottom lead frame 640, 740; and the fourth terminal of the second conductive element 620, 720 is electrically connected to the top lead frame 650, 750. In step 803, form a molding compound 670, 770 to encapsulate the top lead frame 650, 750, the bottom lead frame 640, 740, the first conductive element 610, 710 and the second conductive element 620, 720. The outer leads 654, 754 of the top lead frame 650, 750 are exposed outside the molding compound 670, 770. The complete structure is illustrated in FIG. 8a and FIG. 9a. The details and varieties about the structure and the process have been described previously and it will not be described herein.

To make a brief summary, the present invention (e.g., the third embodiment and the fourth embodiment) has following advantages: 1. The top lead frame may be a one-piece-form, so it has low inner impedance; 2. The structure (see FIG. 9a) has no parasitic inductance caused by the PCB and it has an optimized short EMI loop; 3. The heat-dissipation ability of the structure is excellent because the heat generated by the first conductive element and the second conductive element can simultaneously dissipate from the bottom lead frame and the top lead frame; 4. The structure has excellent extensibility to form a stacking SiP module; 5. By wire-free process, parasitic inductance caused by the wires can be reduced a lot.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

What is claimed is:

1. A package structure, comprising:
   a bottom lead frame;
   a top lead frame having a platform and a plurality of outer leads;
   a first conductive element comprising a first terminal and a second terminal, disposed between the top lead frame and the bottom lead frame, wherein the first terminal of the first conductive element is electrically connected to the bottom lead frame, and the second terminal of the first conductive element is electrically connected to the top lead frame, respectively; and
   a second conductive element, disposed between the top lead frame and the bottom lead frame, wherein the third terminal of the second conductive element is electrically connected to the bottom lead frame, and the fourth terminal of the second conductive element is electrically connected to the top lead frame;
   wherein the bottom lead frame is located between a first outer lead and a second outer lead of the plurality of outer leads, and the top lead frame and the bottom lead frame are spaced apart without contacting each other.

2. The package structure according to claim 1, further comprising a heat-dissipation device disposed on the top lead frame.

3. The package structure according to claim 1, further comprising a molding compound encapsulating the top lead frame, the bottom lead frame, the first conductive element and the second conductive element, wherein the outer leads of the top lead frame are exposed outside the molding compound.

4. The package structure according to claim 1, wherein the platform has a first portion and a second portion, wherein the first portion is horizontally spaced from the second portion, wherein each of the first portion and the second portion of the platform is respectively integrated with at least one of the outer leads.

5. The package structure according to claim 1, the platform has a first portion and a second portion, wherein the first portion and the second portion are substantially at the same horizontal level.

6. The package structure according to claim 1, wherein each terminal is electrically connected to a corresponding lead frame by soldering, Ag gluing or ball bonding.

7. The package structure according to claim 1, wherein each of the first conductive element and the second conductive element is an IC chip, a MOSFET, an IGBT, a diode, a resistor, an inductor, a choke or a capacitor.

8. The package structure according to claim 1, wherein each of the first conductive element and the second conductive element is a MOSFET.

9. The package structure according to claim 1, wherein the platform has a first portion and a second portion, further comprising a third conductive element disposed on the top lead frame, wherein a fifth terminal of the third conductive element is electrically connected to the first portion of the platform, and a sixth terminal of the third conductive element is electrically connected to the second portion of the platform.

10. The package structure according to claim 9, wherein the top lead frame, the bottom lead frame, the first conductive element, the second conductive element and the third conductive element are configured so as to form a circuit loop.

11. The package structure according to claim 9, further comprising a molding compound encapsulating the top lead frame, the bottom lead frame, the first conductive element, the second conductive element and the third conductive element, wherein the outer leads of the top lead frame are exposed outside the molding compound.

12. The package structure according to claim 9, wherein the third conductive element is a capacitor.

13. The package structure according to claim 1, wherein the plurality of outer leads are integrally formed with the platform.

14. The package structure according to claim 1, wherein the first conductive element further comprises a third terminal, wherein the second terminal and the third terminal of the first conductive element are electrically connected to the top lead frame.

15. A package structure, comprising:
    a bottom lead frame;
    a top lead frame having a platform and a plurality of outer leads;
    a first conductive element comprising a first terminal, a second terminal and a third terminal, wherein the first conductive element is disposed between the top lead frame and the bottom lead frame, wherein the first terminal of the first conductive element is electrically connected to the bottom lead frame, and the second terminal and the third terminal of the first conductive element are electrically connected to the top lead frame; and
    a second conductive element comprising a fourth terminal and a fifth terminal, wherein the second conductive element is disposed between the top lead frame and the bottom lead frame, wherein the fourth terminal of the second conductive element is electrically connected to the bottom lead frame, and the fifth terminal of the second conductive element is electrically connected to the top lead frame;
    wherein the bottom lead frame is located between a first outer lead and a second outer lead of the plurality of outer leads.

16. A package structure, comprising:
    a bottom lead frame;
    a top lead frame having a platform and a plurality of outer leads;
    a first electronic device comprising a first terminal, a second terminal and a third terminal, wherein the first electronic device is disposed between the top lead frame and the bottom lead frame, wherein the first terminal of the first electronic device is electrically connected to the bottom lead frame, and the second terminal and the third terminal of the first electronic device are electrically connected to the top lead frame; and a second electronic device comprising a fourth terminal, a fifth terminal and a sixth terminal, wherein the second electronic device is disposed between the top lead frame and the bottom lead frame, wherein the fourth terminal of the second electronic device is electrically connected to the top lead frame, and the fifth terminal and the sixth terminal of the second electronic device are electrically connected to the bottom lead frame.

17. The package structure according to claim 16, wherein the bottom lead frame is located between a first outer lead and a second outer lead of the plurality of outer leads.

* * * * *